United States Patent
Sung et al.

(10) Patent No.: US 10,917,993 B1
(45) Date of Patent: Feb. 9, 2021

(54) FAN GANTRY

(71) Applicants: Inventec (Pudong) Technology Corporation, Shanghai (CN); INVENTEC CORPORATION, Taipei (TW)

(72) Inventors: Tai-Jung Sung, Taipei (TW); Yi-Hsin Chen, Taipei (TW); Jian-Hua Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/714,781

(22) Filed: Dec. 15, 2019

(30) Foreign Application Priority Data

Nov. 18, 2019 (CN) .......................... 2019 1 1128054

(51) Int. Cl.
*H05K 7/20* (2006.01)
*H05K 5/02* (2006.01)
*H05K 5/03* (2006.01)

(52) U.S. Cl.
CPC ....... *H05K 7/20172* (2013.01); *H05K 5/0221* (2013.01); *H05K 5/0247* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 6,115,250 A | * | 9/2000 | Schmitt .............. | H05K 7/20727 165/104.34 |
| 7,054,155 B1 | * | 5/2006 | Mease ................ | H05K 7/20581 165/104.34 |
| 7,236,361 B2 | * | 6/2007 | Cote .................... | G11B 33/127 165/80.3 |
| 7,259,962 B2 | * | 8/2007 | Chen ........................ | G06F 1/20 361/695 |
| 7,623,344 B2 | * | 11/2009 | Beall ....................... | G06F 1/183 361/679.48 |
| 8,272,852 B2 | * | 9/2012 | Li ....................... | H05K 7/20727 417/423.14 |
| 8,405,988 B2 | * | 3/2013 | Wang ................. | H05K 7/20172 361/695 |
| 9,250,662 B2 | * | 2/2016 | Tang ....................... | G06F 1/184 |

(Continued)

*Primary Examiner* — Xanthia C Cunningham
(74) *Attorney, Agent, or Firm* — CKC & Partners Co., LLC

(57) ABSTRACT

A fan gantry includes a frame structure, a supporting structure, a cover body and a thumb screw. The frame structure includes two side walls and a first connecting plate. The side walls define some spaces therebetween. Each side wall has an opening. The openings stagger with the spaces. The first connecting plate is disposed on one side wall. The supporting structure includes two structural plates opposite to each other and connected between the side walls. The structural plates define a channel aligning with the openings and allowing some electric cables to penetrate through. The cover body connects with the frame structure to cover the channel. The thumb screw is disposed on a second connecting plate of the cover body. When the cover body covers the channel, the second connecting plate abuts against the first connecting plate, and the thumb screw locks to the first connecting plate.

10 Claims, 5 Drawing Sheets

(56) References Cited

U.S. PATENT DOCUMENTS

| | | | |
|---|---|---|---|
| 10,165,696 B1* | 12/2018 | Blasingame | H05K 5/0208 |
| 2002/0141154 A1* | 10/2002 | Huang | H05K 7/20172 |
| | | | 361/688 |
| 2004/0130872 A1* | 7/2004 | Cravens | H05K 7/20727 |
| | | | 361/695 |
| 2005/0227608 A1* | 10/2005 | Wu | G06F 1/20 |
| | | | 454/184 |
| 2007/0135033 A1* | 6/2007 | Kao | H05K 7/20727 |
| | | | 454/184 |
| 2011/0157817 A1* | 6/2011 | Li | G06F 1/20 |
| | | | 361/679.48 |
| 2012/0113591 A1* | 5/2012 | Chuang | H05K 7/20172 |
| | | | 361/695 |
| 2012/0114477 A1* | 5/2012 | Li | F04D 29/601 |
| | | | 415/213.1 |
| 2016/0234966 A1* | 8/2016 | Li | F16M 13/02 |

* cited by examiner

FAN GANTRY

RELATED APPLICATIONS

This application claims priority to Chinese Application Serial Number 201911128054.5 filed Nov. 18, 2019, which is herein incorporated by reference.

BACKGROUND

Technical Field

The present disclosure relates to fan gantries. More particularly, the present disclosure relates to fan gantries installed in electric equipment.

Description of Related Art

With the advancement of science and technology today, the demand of people for electronic equipment has been increasing. In order to make the electronic equipment better meet the needs of consumers, apart from the continuous enhancement of functions and operating efficiency, the optimization of the heat dissipation system is often an important area that manufacturers highly concern.

In addition to improving the design of the heat dissipation system itself, manufacturers have to also take into account the configuration of the internal components and the heat dissipation system in order to achieve a better space utilization.

SUMMARY

A technical aspect of the present disclosure is to provide a fan gantry which can allow a plurality of electric cables to penetrate through such that the electric components located at two opposite sides of the fan gantry can be electrically connected.

According to an embodiment of the present disclosure, a fan gantry includes a frame structure, a supporting structure, a cover body and a thumb screw. The frame structure includes two side walls and a first connecting plate. The side walls extend along a first direction. The side walls are opposite to each other. The side walls define a plurality of accommodation spaces therebetween. The accommodation spaces are arranged along the first direction and respectively configured to accommodate a fan. The side walls respectively have an opening. The openings align with each other and stagger with the accommodation spaces. The first connecting plate is disposed on one of the side walls and is away from the accommodation spaces. The supporting structure includes two structural plates. The structural plates are opposite to each other and respectively connected between the side walls. The structural plates define a channel therebetween. The channel aligns with the openings and is configured to allow a plurality of electric cables to penetrate through along a second direction. The second direction is perpendicular to the first direction. The cover body is pivotally connected with the frame structure and configured to cover the channel. The cover body has a second connecting plate. The thumb screw is rotatably disposed on the second connecting plate. When the cover body covers the channel, the second connecting plate abuts against the first connecting plate, and the thumb screw is locked to the first connecting plate.

In one or more embodiments of the present disclosure, each of the openings is U-shaped.

In one or more embodiments of the present disclosure, the supporting structure is located between two of the accommodation spaces.

In one or more embodiments of the present disclosure, the supporting structure further includes a base plate. The base plate is connected with the structural plates to form a U-shaped structure. The structural plates and the base plate together define the channel.

In one or more embodiments of the present disclosure, the structural plates and the base plate are of an integrally-formed structure.

In one or more embodiments of the present disclosure, the cover body includes a cover plate and two side plates. The side plates are opposite to each other. The cover plate connects between the side plates. The side plates are perpendicular to the cover plate. The base plate and the cover plate are opposite to each other. When the cover body covers the channel, the cover plate and the base plate are parallel with each other.

In one or more embodiments of the present disclosure, each of the side plates has a first buckling portion. An end of each of the side plates is pivotally connected with the frame structure. Each of the first buckling portions is located at another end of the corresponding side plate. The frame structure has two second buckling portions. The second buckling portions are respectively connected with the side walls. When the cover body covers the channel, the first buckling portions are respectively buckled to the second buckling portions.

In one or more embodiments of the present disclosure, each of the first buckling portions is a recessed structure, and each of the second buckling portions is a columnar structure.

In one or more embodiments of the present disclosure, the second connecting plate connects with one of the side plates. The second connecting plate has a through hole. The thumb screw penetrates through the through hole. The first connecting plate has a screw hole. The screw hole is configured to allow the thumb screw to couple with.

In one or more embodiments of the present disclosure, the cover body further includes a positioning pole. The positioning pole is disposed on the second connecting plate. When the cover body covers the channel, the positioning pole extends along a third direction. The third direction is perpendicular to the first direction and the second direction.

When compared with the prior art, the above-mentioned embodiments of the present disclosure have at least the following advantages:

(1) A user can loosen the thumb screw from the screw hole of the first connecting plate through rotating the thumb screw disposed on the second connecting plate, so as to open the cover body and expose the channel. At this point, the user can place the electric cables in the channel, such that the electric cables can penetrate through the channel and extend along the second direction. Afterwards, the user can rotate again the cover body relative to the frame structure, so as to cover the channel by the cover body. Moreover, the thumb screw is tightly locked to the screw hole of the first connecting plate, in order to maintain the closing status of the cover body and to prevent the electric cables from jumping off the channel due to vibration during the operation of the electric equipment. In this way, the user can electrically connect the electric components located at two opposite sides of the fan gantry through the electric cables penetrating through the channel in a simple and easy manner, such that the way of configuration of the components inside the electric equipment can be more flexible. Moreover, since the process of opening and closing of the cover body is simple and easy without any extra component or tool, it can be convenient to the user.

(2) When the cover body covers the channel, the first buckling portions of the side plates are buckled to the second buckling portions of the frame structure, such that the side plates can enhance the structural strength of the portion of the side walls around the openings, and the structural strength of the frame structure is also enhanced. In other words, under the conditions that the electric cable can penetrate through the fan gantry and electrically connect with the electric components located at two opposite sides of the fan gantry, the strength of the frame structure is not reduced.

(3) When the cover body covers the channel, the positioning pole is in a vertical status and is appropriate to penetrate through a positioning hole of a top cover of the electric equipment, which can enhance the over strength of the electric equipment.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
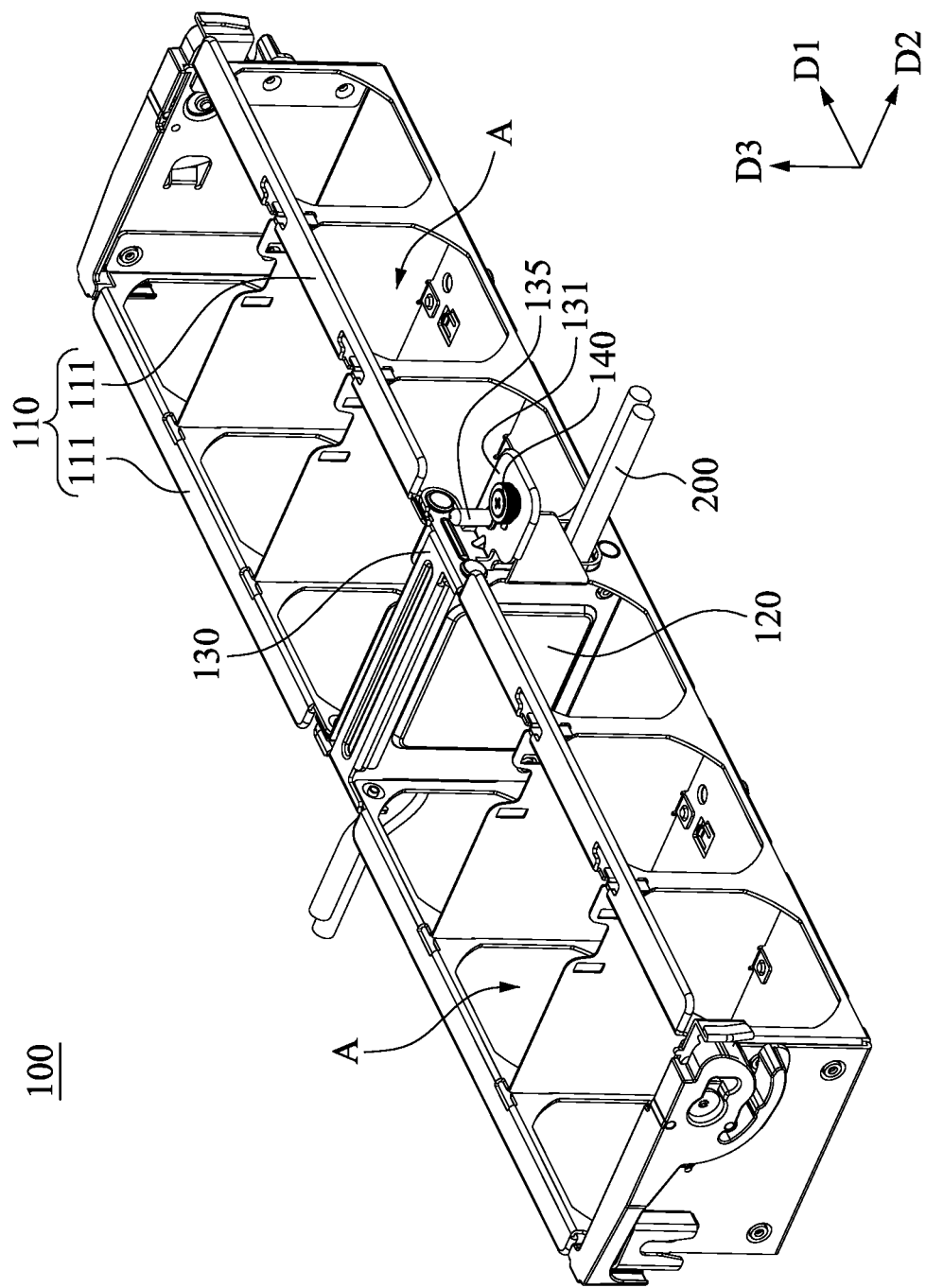
FIG. 1 is a schematic view of a fan gantry according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a fan gantry 100 according to an embodiment of the present disclosure. In this embodiment, as shown in FIG. 1, a speaker 100 includes a frame structure 110, a supporting structure 120 and a cover body 130. The frame structure 110 includes two side walls 111. The side walls 111 extend along a first direction D1. The side walls 111 are opposite to each other. The side walls 111 define a plurality of accommodation spaces A therebetween. The accommodation spaces A are also arranged along the first direction D1 and are respectively configured to accommodate a fan (not shown). The fan gantry 100 accommodated with a plurality of fans is appropriate to be disposed inside an electric equipment (not shown) to carry out heat dissipation of the electric equipment.

Figure 2:
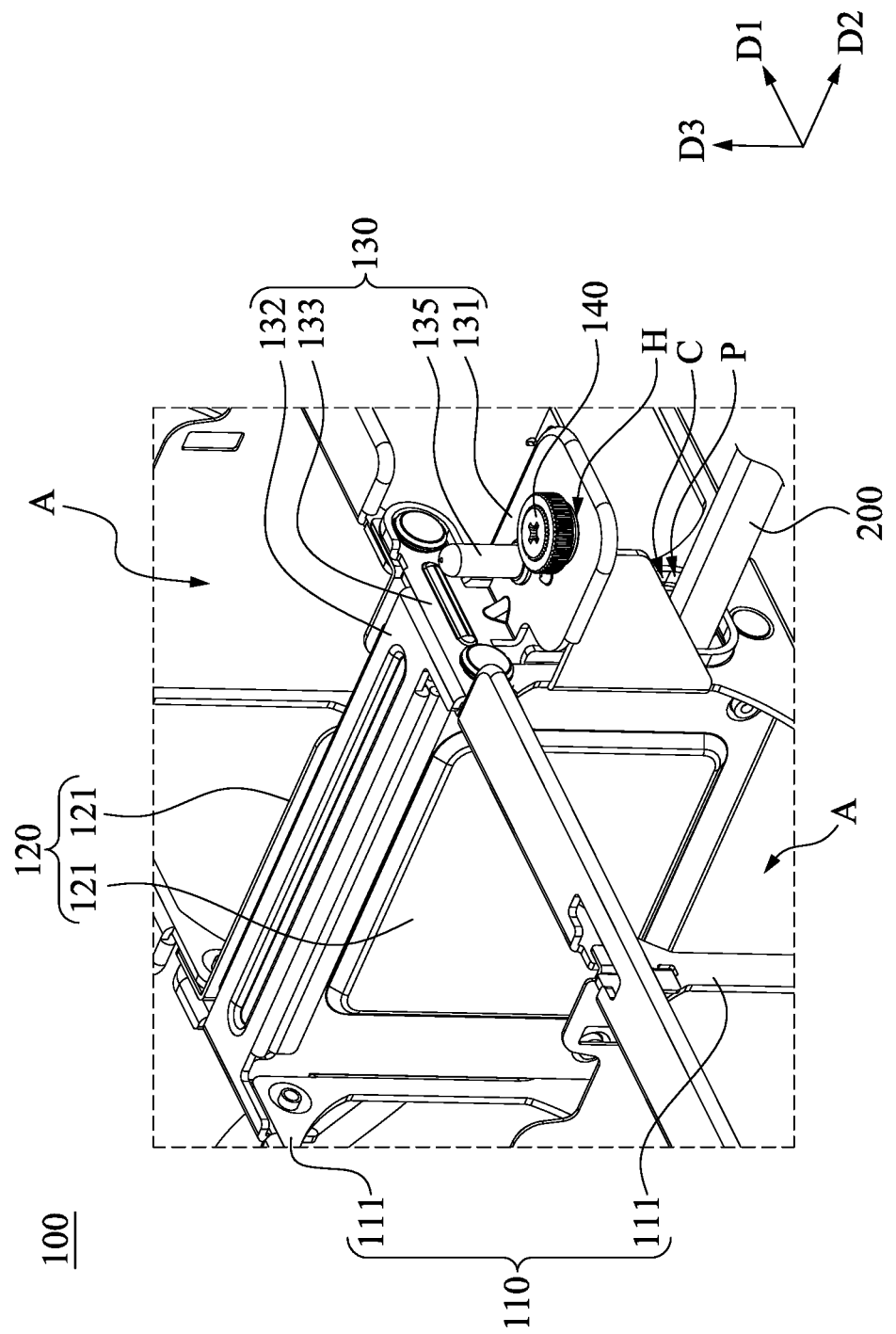
FIG. 2 is a partially enlarged schematic view of the fan gantry of FIG. 1, in which the cover body is in a closing status.
Figure 3:
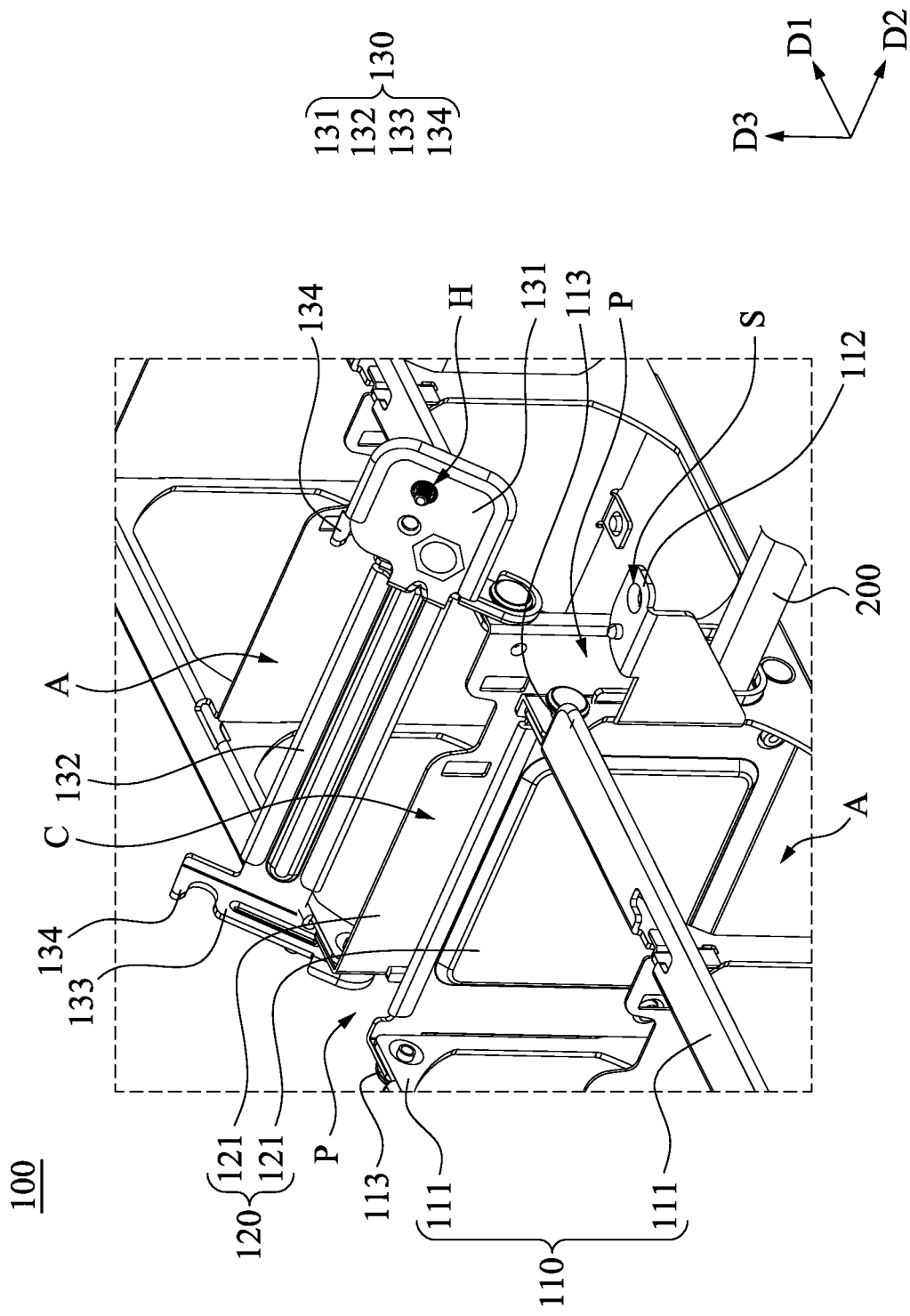
FIG. 3 is a partially enlarged schematic view of the fan gantry of FIG. 1, in which the cover body is in an opening status.
Figure 4:
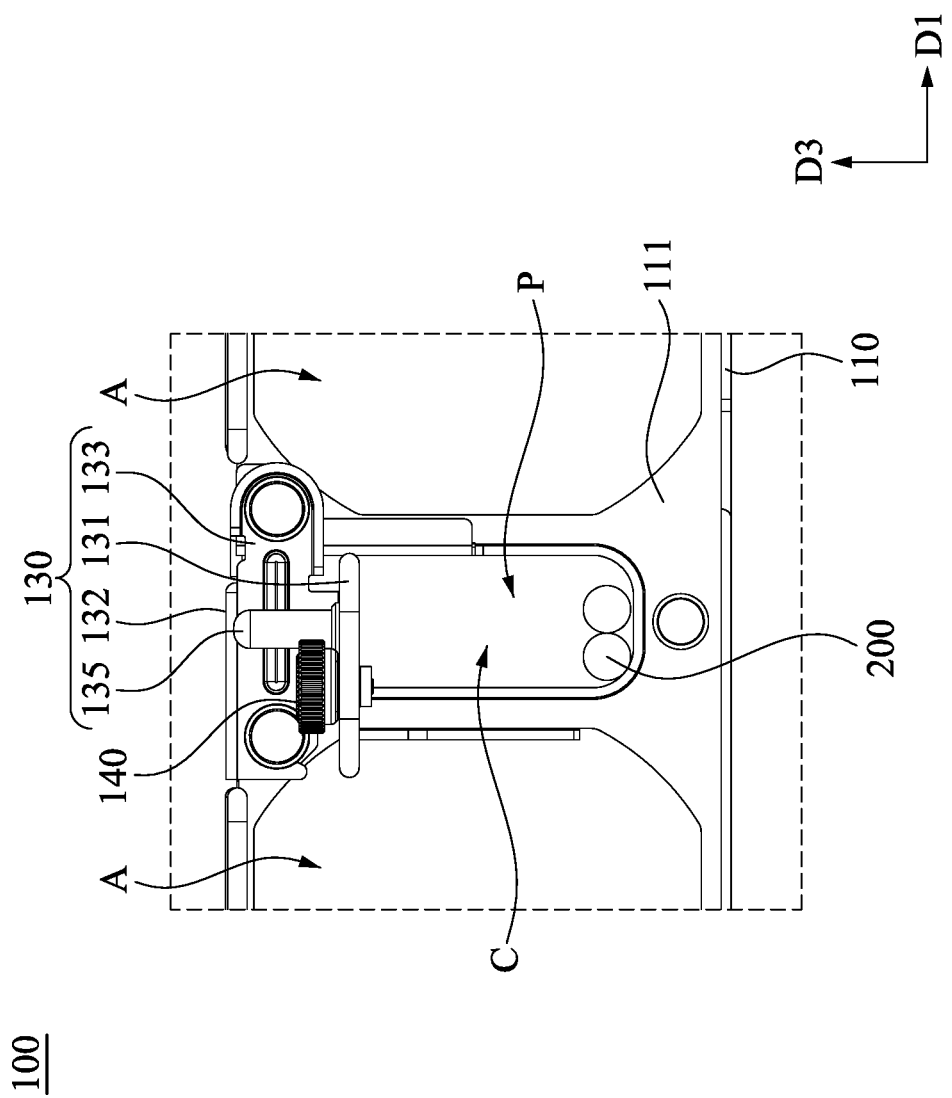
FIG. 4 is a partially enlarged front view of the fan gantry of FIG. 1, in which the cover body is in a closing status.

Reference is made to FIGS. 2-4. FIG. 2 is a partially enlarged schematic view of the fan gantry 100 of FIG. 1, in which the cover body 130 is in a closing status. FIG. 3 is a partially enlarged schematic view of the fan gantry 100 of FIG. 1, in which the cover body 130 is in an opening status. FIG. 4 is a partially enlarged front view of the fan gantry 100 of FIG. 1, in which the cover body 130 is in a closing status. In this embodiment, as shown in FIGS. 2-4, the side walls 111 of the frame structure 110 respectively have an opening P. The openings P align with each other and stagger with the accommodation spaces A. The frame structure 110 further includes a first connecting plate 112. The first connecting plate 112 is disposed on one of the side walls 111 and is away from the accommodation spaces A. The supporting structure 120 includes two structural plates 121. The structural plates 121 are opposite to each other and are respectively connected between the side walls 111. The structural plates 121 define a channel C therebetween. The channel C aligns with the openings P. The channel C is configured to allow a plurality of electric cables 200 to penetrate through along a second direction D2. The second direction D2 is perpendicular to the first direction D1. The cover body 130 is pivotally connected with the frame structure 110. This means the cover body 130 can rotate relative to the frame structure 110. The cover body 130 is configured to cover the channel C, which means the cover body 130 is in a closing status, in order to prevent the electric cables 200 from jumping off the channel C due to vibration during the operation of the electric equipment. Moreover, the cover body 130 has a second connecting plate 131. The fan gantry 100 further includes a thumb screw 140. The thumb screw 140 is rotatably disposed on the second connecting plate 131. When the cover body 130 covers the channel C, as shown in FIGS. 1-2, the second connecting plate 131 of the cover body 130 abuts against the first connecting plate 112 of the frame structure 110, and the thumb screw 140 is locked to the first connecting plate 112 of the frame structure 110, in order to fix the relative position between the cover body 130 and the frame structure 110.

Furthermore, the supporting structure 120 is located between two of the accommodation spaces A. In other words, during the operation of the electric equipment, the electric cable 200 can penetrate through the channel C among the fans and electrically connect with the electric components (not shown) located at two opposite sides of the fan gantry 100.

Figure 5:
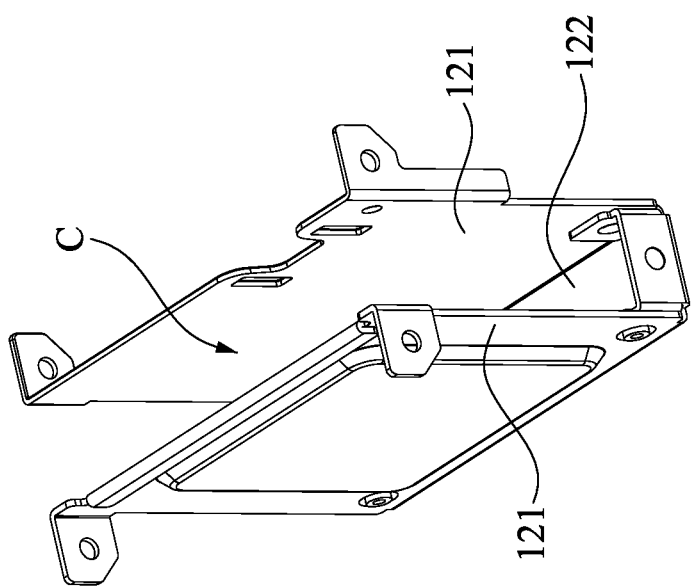
FIG. 5 is a schematic view of the supporting structure of FIG. 1.

Reference is made to FIG. 5. FIG. 5 is a schematic view of the supporting structure 120 of FIG. 1. To be more specific, as shown in FIG. 5, the supporting structure 120 further includes a base plate 122. The base plate 122 is connected with the structural plates 121 to form a U-shaped structure, so as to enhance the structural strength of the frame structure 120. The structural plates 121 and the base plate 122 together define the channel C. The means the channel C is surrounded by the structural plates 121 and the base plate 122. In practical applications, the structural plates 121 and the base plate 122 are of an integrally-formed structure, such that the structural strength of the frame structure 120 can be further enhanced.

Moreover, as shown in FIGS. 2-4, the cover body 130 includes a cover plate 132 and two side plates 133. The side plates 133 are opposite to each other. The cover plate 132 is connected between the side plates 133. The side plates 133 are perpendicular to the cover plate 132, such that the structural strength of the cover body 130 can be enhanced. Moreover, the base plate 122 and the cover plate 132 are opposite to each other. When the cover body 130 covers the channel C, which means the cover body 130 is in a closing status, the cover plate 132 and the base plate 122 are parallel with each other. However, this does not intend to limit the present disclosure.

In addition, as shown in FIG. 3, an end of each of the side plates 133 of the cover body 130 is pivotally connected with the frame structure 110, and each of the side plates 133 has a first buckling portion 134. Each of the first buckling portions 134 is located at another end of the corresponding side plate 133. Correspondingly, the frame structure 110 has two second buckling portions 113. The second buckling portions 113 are respectively connected with the side walls 111 of the frame structure 110. When the cover body 130 covers the channel C, the first buckling portions 134 of the side plates 133 are respectively buckled to the second buckling portions 113 of the frame structure 110. After the first buckling portions 134 of the side plates 133 are buckled to the second buckling portions 113 of the frame structure 110, the side plates 133 can enhance the structural strength of the portion of the side walls 111 around the openings P, such that the structural strength of the frame structure 110 is also enhanced. In other words, under the conditions that the electric cable 200 can penetrate through the fan gantry 100 and electrically connect with the electric components located at two opposite sides of the fan gantry 100, the strength of the frame structure 110 is not reduced. In practical applications, as shown in FIG. 3, each of the first buckling portions 134 of the side plates 133 is a recessed structure, and each of the second buckling portions 113 of the frame structure 110 is a columnar structure. However, this does not intend to limit the present disclosure.

To be more specific, as shown in FIGS. 2-3, the second connecting plate 131 of the cover body 130 connects with one of the side plates 133. The second connecting plate 131 has a through hole H. The thumb screw 140 penetrates through the through hole H and is rotatably disposed on the second connecting plate 131. Moreover, as shown in FIG. 3, the first connecting plate 112 of the frame structure 110 has a screw hole S. The screw hole S is configured to allow the thumb screw 140 to couple with.

In simple words, a user can loosen the thumb screw 140 from the screw hole S of the first connecting plate 112 through rotating the thumb screw 140 disposed on the second connecting plate 131, so as to open the cover body 130 and expose the channel C. At this point, the user can place the electric cables 200 in the channel C, such that the electric cables 200 can penetrate through the channel C and extend along the second direction D2. Afterwards, the user can rotate again the cover body 130 relative to the frame structure 110, so as to cover the channel C by the cover body 130. Moreover, the thumb screw 140 is tightly locked to the screw hole S of the first connecting plate 112, in order to maintain the closing status of the cover body 130. In this way, the user can electrically connect the electric components located at two opposite sides of the fan gantry 100 through the electric cables 200 penetrating through the channel C in a simple and easy manner, such that the way of configuration of the components inside the electric equipment can be more flexible. Moreover, since the process of opening and closing of the cover body 130 is simple and easy without any extra component or tool, it can be convenient to the user.

In addition, as shown in FIGS. 3-4, each of the openings P of the side walls 111 is U-shaped, which facilitates for the user to place the electric cables 200 in the channel C.

In this embodiment, as shown in FIGS. 1-2 and 4, the cover body 130 further includes a positioning pole 135. The positioning pole 135 is disposed on the second connecting plate 131 of the cover body 130. When the cover body 130 covers the channel C, the positioning pole 135 extends along a third direction D3. The third direction D3 is perpendicular to the first direction D1 and the second direction D2. In other words, when the cover body 130 covers the channel C, the positioning pole 135 is in a vertical status and is appropriate to penetrate through a positioning hole of a top cover of the electric equipment, which can enhance the over strength of the electric equipment.

In conclusion, when compared with the prior art, the aforementioned embodiments of the present disclosure have at least the following advantages:

(1) A user can loosen the thumb screw from the screw hole of the first connecting plate through rotating the thumb screw disposed on the second connecting plate, so as to open the cover body and expose the channel. At this point, the user can place the electric cables in the channel, such that the electric cables can penetrate through the channel and extend along the second direction. Afterwards, the user can rotate again the cover body relative to the frame structure, so as to cover the channel by the cover body. Moreover, the thumb screw is tightly locked to the screw hole of the first connecting plate, in order to maintain the closing status of the cover body and to prevent the electric cables from jumping off the channel due to vibration during the operation of the electric equipment. In this way, the user can electrically connect the electric components located at two opposite sides of the fan gantry through the electric cables penetrating through the channel in a simple and easy manner, such that the way of configuration of the components inside the electric equipment can be more flexible. Moreover, since the process of opening and closing of the cover body is simple and easy without any extra component or tool, it can be convenient to the user.

(2) When the cover body covers the channel, the first buckling portions of the side plates are buckled to the second buckling portions of the frame structure, such that the side plates can enhance the structural strength of the portion of the side walls around the openings, and the structural strength of the frame structure is also enhanced. In other words, under the conditions that the electric cable can penetrate through the fan gantry and electrically connect with the electric components located at two opposite sides of the fan gantry, the strength of the frame structure is not reduced.

(3) When the cover body covers the channel, the positioning pole is in a vertical status and is appropriate to penetrate through a positioning hole of a top cover of the electric equipment, which can enhance the over strength of the electric equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A fan gantry, comprising:
a frame structure, comprising:
   two side walls extending along a first direction and being opposite to each other, the side walls defining a plurality of accommodation spaces therebetween, the accommodation spaces being arranged along the first direction and respectively configured to accommodate a fan, the side walls respectively having an opening, the openings aligning with each other and staggering with the accommodation spaces; and
   a first connecting plate disposed on one of the side walls and being away from the accommodation spaces;
a supporting structure comprising two structural plates, the structural plates being opposite to each other and respectively connected between the side walls, the structural plates defining a channel therebetween, the channel aligning with the openings and being configured to allow a plurality of electric cables to penetrate through along a second direction, the second direction being perpendicular to the first direction;
a cover body being pivotally connected with the frame structure and configured to cover the channel, the cover body having a second connecting plate; and
a thumb screw rotatably disposed on the second connecting plate,
wherein when the cover body covers the channel, the second connecting plate abuts against the first connecting plate, and the thumb screw is locked to the first connecting plate.

2. The fan gantry of claim 1, wherein each of the openings is U-shaped.

3. The fan gantry of claim 1, wherein the supporting structure is located between two of the accommodation spaces.

4. The fan gantry of claim 1, wherein the supporting structure further comprises a base plate connected with the structural plates to form a U-shaped structure, the structural plates and the base plate together define the channel.

5. The fan gantry of claim 4, wherein the structural plates and the base plate are of an integrally-formed structure.

6. The fan gantry of claim 4, wherein the cover body comprises a cover plate and two side plates opposite to each other, the cover plate connects between the side plates, the side plates are perpendicular to the cover plate, the base plate and the cover plate are opposite to each other, when the cover body covers the channel, the cover plate and the base plate are parallel with each other.

7. The fan gantry of claim 6, wherein each of the side plates has a first buckling portion, an end of each of the side plates is pivotally connected with the frame structure, each of the first buckling portions is located at another end of the corresponding side plate, the frame structure has two second buckling portions respectively connected with the side walls, when the cover body covers the channel, the first buckling portions are respectively buckled to the second buckling portions.

8. The fan gantry of claim 7, wherein each of the first buckling portions is a recessed structure, and each of the second buckling portions is a columnar structure.

9. The fan gantry of claim 6, wherein the second connecting plate connects with one of the side plates, the second connecting plate has a through hole, the thumb screw penetrates through the through hole, the first connecting plate has a screw hole configured to allow the thumb screw to couple with.

10. The fan gantry of claim 1, wherein the cover body further comprises a positioning pole disposed on the second connecting plate, when the cover body covers the channel, the positioning pole extends along a third direction, the third direction is perpendicular to the first direction and the second direction.

* * * * *